United States Patent [19]

Liou et al.

[11] Patent Number: 5,162,884
[45] Date of Patent: Nov. 10, 1992

[54] INSULATED GATE FIELD-EFFECT TRANSISTOR WITH GATE-DRAIN OVERLAP AND METHOD OF MAKING THE SAME

[75] Inventors: Fu-Tai Liou, Carrollton; Frank F. Bryant, Denton, both of Tex.

[73] Assignee: SGS-Thomson Microelectronics, Inc., Carrollton, Tex.

[21] Appl. No.: 676,083

[22] Filed: Mar. 27, 1991

[51] Int. Cl.$^5$ .................. H01L 29/06; H01L 21/265
[52] U.S. Cl. ..................... 257/384; 437/41; 437/233; 257/344; 257/900
[58] Field of Search ............ 357/23.4, 23.9, 59; 437/41, 233

[56] References Cited

U.S. PATENT DOCUMENTS

| | | | |
|---|---|---|---|
| 4,356,623 | 11/1982 | Hunter | 29/571 |
| 4,384,301 | 5/1983 | Tasch, Jr. et al. | 357/23 |
| 4,851,360 | 7/1989 | Haken et al. | 437/29 |
| 4,878,100 | 10/1989 | McDavid | 357/23.3 |
| 4,907,048 | 3/1990 | Huang | 357/23.4 |
| 4,992,134 | 2/1991 | Gupta et al. | 156/628 |

OTHER PUBLICATIONS

Izawa, et al., "Impact of the Gate-Drain Overlapped Device (GOLD) for Deep Submicrometer VLSI", *Trans. Electron Devices*, vol. 35, No. 12 (IEEE, 1988), pp. 2088-2093.

Pfiester, et al., "A Self-Aligned LDD/Channel Implanted ITLDD Process with Selectively Deposited Poly Gates for CMOS VLSI", *International Election-Device Meeting*, Paper 32.2.1 (IEEE, Dec. 1989), pp. 769-772.

Chen, et al., "A Highly Reliable 0.3 pm N-channel MOSFET Using Poly Spacers", 1990 *Symposium on VLSI Technology* (IEEE, May, 1990), pp. 39-40.

Lee, et al., "Doping Effects in Reactive Plasma Etching of Heavily Doped Silicon", *Appl. Phys. Lett.* vol. 46, No. 3, (Feb., 1985), pp. 260-262.

MOGAB, et al., "Anisotropic plasma etching of polysilicon", *J. Vac. Sci. Technol.*, vol. 17, No. 3 (May/Jun. 1980), pp. 721-730.

L. M. Ephrath, et al., *VLSI Science and Technology*/1982, edited by C. Dell'oca and W. Bullis (Electrochemical Society, Pennington, N.J. 1982) p. 108-115.

Primary Examiner—Edward J. Wojciechowicz
Attorney, Agent, or Firm—Rodney M. Anderson; Lisa K. Jorgenson; Richard K. Robinson

[57] ABSTRACT

A method of forming an insulated-gate field-effect transistor, and the transistor formed thereby, is described. According to a first embodiment, an inverted-T gate structure is formed by the deposition of a polycrystalline silicon layer, followed by the deposition of a metal silicide layer thereover. The metal silicide layer is etched with etchant which does not significantly etch polysilicon, to define the upper portion of the gate electrode. The reachthrough lightly-doped source/drain extensions are then implanted through the polysilicon layer, using the upper gate electrode portion as a mask. Sidewall spacers are formed on the sides of the upper portion of the gate electrode, and the polysilicon etched using the spacers as a mask, to define the inverted-T gate structure. In addition, either with the inverted-T gate structure or in conjunction with conventional gate structures, a method is disclosed which uses a first sidewall film to define the location of the source/drain implant relative to the LDD regions, and a second sidewall spacer to space direct react silicide formation from the gate, so that the dimensions of the graded junction may be defined independently from that of the silicidation reaction.

12 Claims, 4 Drawing Sheets

INSULATED GATE FIELD-EFFECT TRANSISTOR WITH GATE-DRAIN OVERLAP AND METHOD OF MAKING THE SAME

This invention is in the field of integrated circuits, and is more particularly directed to insulated gate field-effect transistors with graded junctions.

BACKGROUND OF THE INVENTION

In the field of integrated circuit manufacture, recent and continuing advances allow for semiconductor structures to be fabricated of increasingly smaller dimensions. For example, gate electrodes for insulated-gate field effect transistors (IGFETs) of widths below one micron are commonly being manufactured, with the fabrication of transistors with smaller than one-half micron gate electrodes expected in the foreseeable future. As is well known, the ability to fabricate increasingly small transistors allows for the manufacture of integrated circuits with larger numbers of functions per unit area. In addition, such smaller IGFETs provide increasingly higher transconductance values, so that circuit functions implemented with such devices operate with faster switching speeds.

As is well known in the art, short channel length IGFETs are vulnerable to certain performance and reliability problems. A first one of such problems is the so-called "hot electron", or "hot carrier" effect, where high-energy carriers are generated by high electric fields at the drain junction, become trapped in the gate dielectric, and cause a threshold voltage shift. Another problem to which short channel length IGFETs are particularly prone is the so-called "short-channel effect", which increases sub-threshold leakage between drain and source. In addition, source and drain depletion regions become closer to one another as the transistor sizes decrease, reducing the punch-through voltage for such devices.

It is known that the use of graded source/drain junctions improves the susceptibility of modern IGFETs to each of these problems, as the localized electric field at the metallurgical junctions is lower for a graded junction relative to an abrupt junction. A well-known conventional technique for fabricating graded junction metal-oxide-semiconductor field-effect transistors (MOSFETs) implants a lightly doped source/drain region self-aligned with the gate electrode, and uses a sidewall insulator spacer on the sides of the gate to space the heavily doped source/drain implant back from the edge of the lightly-doped region, resulting in a graded junction. An example of this technique is described in U.S. Pat. No. 4,356,623. Another technique for forming a graded junction n-channel MOSFET implants two species which have different diffusion rates in the source/drain locations, so that a graded junction results after diffusion; such a technique is described in U.S. Pat. No. 4,851,360 and in U.S. Pat. No. 4,878,100.

While graded junctions according to these methods reduce the deleterious effects observed in short-channel abrupt junction transistors, each method provides the equivalent of a series resistor at the drain end of the channel (and, in conventional processes, also at the source end). The presence of this additional series resistance reduces the performance of the transistors and the circuits implemented thereby. As described in Izawa et al., "Impact of the Gate-Drain Overlapped Device (GOLD) for Deep Submicrometer VLSI", *Trans. Electron Devices*, Vol. 35, No. 12 (IEEE, 1988), pp. 2088–93, a transistor with a gate electrode which overlaps the graded drain region provides for the reduction in the high-electric field short-channel problems noted above, but without significant loss of transistor performance.

Prior techniques for fabricating such overlapping gate electrode transistors, commonly referred to as "inverted-T" transistors, have either been quite complex or require extremely precise process conditions, with little room for error. The Izawa et al. paper noted hereinabove forms the inverted-T gate by relying on a thin native oxide layer, formed by exposure of the first polysilicon layer to air, as an etch stop in the etching of the upper poly layer which, as noted therein, requires highly selective dry etching. Due to the thinness and poor integrity of polysilicon native oxide, it is believed that reliance on native oxide as an etch stop will provide little process margin and poor manufacturability.

Another method for forming an inverted-T gate structure is described in Pfiester, et al., "A Self-Aligned LDD/Channel Implanted ITLDD Process With Selectively-Deposited Poly Gates for CMOS VLSI", *International Electron Device Meeting*, Paper 32.2.1 (IEEE, 1989), pp. 769–772. This method first forms a thin polysilicon layer which will overlap the LDD regions. An oxide layer is then formed over this layer, and removed from the locations at which the gate electrode is to be formed. Selective polysilicon deposition then forms the gate electrode is formed at the locations from which the oxide has been removed, with no polysilicon forming elsewhere.

Another method for forming an overlapping gate structure is described in Chen, et al., "A Highly Reliable 0.3 μm N-channel MOSFET Using Poly Spacers", 1990 *Symposium on VLSI Technology* (IEEE, 1990), pp. 39–40. This paper describes the use of polysilicon spacers instead of oxide spacers, where native oxide on the sides of the polysilicon gate electrode is sufficiently damaged during source/drain implant that the spacers are electrically connected to the gate electrode.

By way of further background, as structures in devices such as IGFETs become increasingly smaller, the series resistance of the narrow conductors therein increase. This is particularly true for sub-micron gate electrodes and source/drain regions. A well-known technique for increasing the conductivity of these structures is the direct reaction of a refractory metal, such as tantalum, titanium, cobalt, tungsten and the like, with the silicon of the gate electrodes and source-drain regions to form a highly conductive metal silicide cladding thereat. It is known that sidewall oxide spacers, as noted hereinabove in the formation of graded drain junctions, provide electrical isolation between the gate electrode and the source/drain regions, as the silicide will not form thereover, allowing a subsequent etch to remove unreacted metal from over the oxide spacers while not significantly disturbing the silicide. An example of a method of forming a silicide-clad transistor in such a manner is described in U.S. Pat. No. 4,384,301. The formation of silicide-cladding in such a manner is commonly referred to in the art as "salicide", referring to the self-aligned nature of the silicide to the conductive structures.

In prior self-aligned silicidation, however, since the same sidewall spacer is used to define the graded junction, or "lightly-doped-drain" ("LDD") region and the separation of the source/drain silicide from the gate silicide, selection of the desired spacer width may not be optimized for either. Particularly for transistors of channel lengths less than one-half micron, it is contemplated that the spacing required for the LDD region will be less than that necessary to maintain isolation between the source/drain silicide and the gate electrode silicide. According to the prior techniques for defining the sidewall spacer thickness, providing a thick enough sidewall spacer to maintain electrical isolation between the silicid layers would require a longer LDD region; accordingly, the benefits of silicidation in such transistors will come at a cost of increased device size, and reduced performance due to the longer than desired LDD regions in series with the transistor channel.

It is therefore an object of this invention to provide an improved method of forming an IGFET with its gate electrode overlapping the drain region.

It is a further object of this invention to provide such a method which has improved robustness for manufacturing.

It is a further object of this invention to provide a method of forming a silicide-clad IGFET with graded junction, where the silicide spacing is optimized independently from the size of the graded junction region.

It is a further object of this invention to provide a method of forming a overlapping gate transistor with silicide cladding, where the silicide spacing may be optimized independently from the size of the graded junction region.

Other objects and advantages will be apparent to those of ordinary skill in the art having reference to the following specification, in combination with the drawings.

SUMMARY OF THE INVENTION

The invention may be incorporated into a method for forming a self-aligned IGFET having a gate electrode which overlaps the drain region. A first gate layer is formed of doped polysilicon, and a second gate layer of a metal silicide is deposited thereover. The gate electrode is defined by etching the metal silicide with an etch which stops on the polysilicon layer. Ion implantation of the lightly-doped drain implant is then performed through the poly layer, using the silicide gate electrode as a mask. Sidewall spacers are then formed on the sides of the gate electrode to form a mask for the etching of the polysilicon gate layer. The heavily-doped source/drain regions are then implanted using the sidewall spacers as a mask, resulting in an inverted-T IGFET with the polysilicon layer overlapping the LDD regions.

The invention may also be incorporated into a method for forming a silicide-clad LDD transistor, both with and without an overlapping gate structure. A first sidewall spacer is provided of a thickness for defining the length of the LDD regions (i.e. the regions not receiving the heavy source/drain implant), either in a rectangular gate structure, or in the inverted-T structure noted hereinabove. In the inverted-T structure with silicide gate electrode, a polysilicon layer is preferably formed over the silicide gate electrode. After implantation of the heavy source/drain region, a second sidewall spacer is provided, with its thickness defined so that direct react silicidation does not short the source/drain regions to the gate. Direct react self-aligned silicidation is then performed to clad the gate and source/drain regions.

DETAILED DESCRIPTION OF THE PREFERRED EMBODIMENTS

Figure 1:
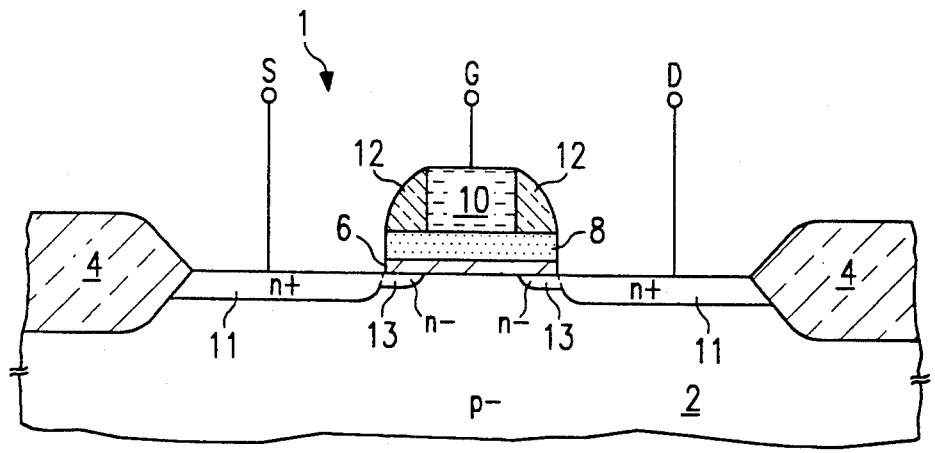
FIG. 1 is a cross-sectional diagram of an inverted-T IGFET formed according to the preferred embodiment of the invention.

Referring first to FIG. 1, the construction of an insulated gate field-effect transistor (IGFET) 1 according to a first embodiment of the invention will now be described. While IGFET 1 is shown in FIG. 1 and is described herein as an n-channel metal-oxide-semiconductor field-effect transistor (MOSFET), as will be the other transistors shown and described herein, it is contemplated that the invention is equally applicable to p-channel IGFETs and MOSFETs, and to IGFETs which utilize material other than silicon dioxide, individually or in combination with other materials. Furthermore, while the fabrication of single transistors of one channel conductivity type is described herein, it is contemplated that conventional CMOS techniques may be applied to these methods to form both p-channel and n-channel transistors in the same device, if desired. It should be noted, however, that many of the deleterious effects of short channel IGFETs to which the present invention is directed generally affect n-channel transistors to a greater extent than p-channel transistors.

It should further be noted that IGFET 1, and transistors according to the alternative embodiments of the invention, are described herein relative to cross-sectional views thereof. It is contemplated that the plan view of these devices will depend upon the particular layout desired, and will be readily apparent to one of ordinary skill in the art from these cross-sectional views.

N-channel IGFET 1 according to this embodiment of the invention is formed at a semiconductor surface of a body or substrate, in a relatively lightly doped p-type layer 2. P-type layer 2 can be a doped portion of a single crystal silicon substrate, a well or tub region diffused into or otherwise doped at a surface, or alternatively may be an epitaxial layer at the surface of the substrate, each formed in the conventional manner. In a CMOS structure, n-type layers, tubs or wells similar to p-type layer 2 will also be present, into which p-channel transistors will be formed. Further in the alternative, IGFET 1 (and the other transistors described herein) may be formed in a silicon-on-insulator layer, such silicon-on-insulator technology being well known in the art.

Disposed over selected portions of p-type layer 2 is isolation oxide 4 for defining active regions of the surface therebetween in the conventional manner. Isolation oxide 4 may be formed according to the conventional local oxidation of silicon (LOCOS) technique, or according to other known techniques, to provide electrical isolation between separate active regions into which transistors such as IGFET 1 are formed. N-type source/drain regions 11, each of which having a lightly-doped extension 13, are at the surface of IGFET 1; the channel of IGFET 1 is, of course, located therebetween in the conventional fashion. As will be apparent from other embodiments disclosed herein, the surfaces of source/drain regions 11 may be clad with a refractory metal silicide for improved conductivity. Overlying the channel region is gate dielectric 6, which may be formed of silicon dioxide, silicon nitride, tantalum oxide, or other known dielectric materials and combinations thereof. Electrical connections to source/drain regions 11 (and to the gate electrode) are illustrated schematically as terminals S, D and G (source, drain and gate, respectively), such connections made by way of conventional metal line contact to these structures through insulating layers thereon.

IGFET 1 according to this embodiment of the invention includes a gate electrode which has an inverted-T shape. Polysilicon lower gate layer 8 is disposed adjacent to gate dielectric 6, and overlies not only the channel region, but also the lightly-doped source/drain extensions 13 on each side According to this embodiment of the invention, upper gate layer 10 is formed of a refractory metal silicide, such as tantalum silicide, and is in contact with polysilicon lower gate layer 8, but does not extend over the full width of polysilicon lower gate layer 8. Alternative materials may be used for upper gate layer 10, so long as such materials may be etched selectively relative to the material of lower gate layer 8 as will be described hereinbelow. Examples of such alternative materials include other metal silicides such as titanium silicide and tungsten silicide. Alternatively, it is contemplated that refractory metals may also be suitable for upper gate layer 10. It is also contemplated that a refractory metal may be deposited as upper gate layer 10, followed by conventional heat treatment so that the metal reacts with the underlying polysilicon of lower gate layer 8, forming a metal silicide at locations of the film near the interface thereof, in varying composition throughout its thickness (i.e., pure metal at the top of layer 10, with polysilicon at the bottom in layer 8, and with metal silicide therebetween); such a composition is contemplated to also provide the selective etch characteristics described herein. Further in the alternative, it is known that various dopants (e.g., boron), and various concentrations thereof, affect the etch rate of polysilicon. Accordingly, a single layer of polysilicon may be used to form both lower gate layer 8 and upper gate layer 10, with the upper portion implanted or otherwise doped in such a manner as to be selectively etchable relative to the lower portion, thus forming the inverted-T gate electrode according to this embodiment of the invention.

Also as shown in FIG. 1, disposed on the sides of upper gate layer 10, and overlying polysilicon lower gate layer 8, are sidewall dielectric spacers 12, formed of silicon dioxide, silicon nitride, metal oxides, or such other material which may be used to form the structure in the manner described hereinbelow.

IGFET 1 operates as a field-effect transistor in the conventional manner, with the voltage at the gate electrode controlling the conduction between source/drain regions 11. IGFET 1 is particularly adapted for extremely small transistors, for example having a channel length between lightly-doped source/drain extensions 13 (i.e., the width of upper gate layer 10) on the order of 0.25$\mu$ to 0.50$\mu$; of course, larger transistors may also benefit from the present invention. The improved benefits for smaller transistors is due to the grading of the source/drain junctions by lightly-doped source/drain ("LDD") extensions 13. In addition, the overlapping of lower gate layer 8 over extensions 13 allows for these regions to be conductive when the gate-to-source voltage exceeds the threshold voltage of IGFET 1. As a result, little series source/drain resistance in the on-state is added by lightly-doped extensions 13. The improvement in reliability and subthreshold performance provided by the use of lightly-doped extensions 13 thus comes with little cost in performance.

Figure 2A:
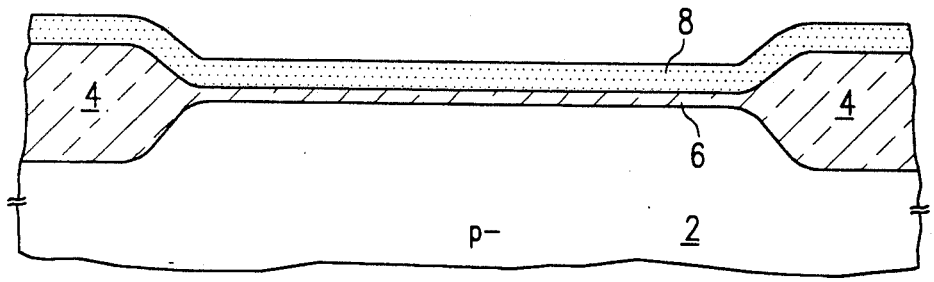
FIGS. 2a through 2g are cross-sectional diagrams of particular steps in the fabrication of the transistor of FIG. 1.

Referring now to the cross-sectional diagrams of FIGS. 2a through 2g, the preferred method of fabricating IGFET 1 of FIG. 1 will now be described in detail. In FIG. 2a, the structure is illustrated after conventional formation of p-type layer 2 (whether the substrate, a well in a CMOS-type structure, an epitaxial layer, or other equivalent region), and the definition of active regions at a surface thereof by field oxide 4. Overlying the active regions of p-type layer 2 is gate dielectric 6. A preferred example of gate dielectric 6 is thermal silicon dioxide, having a thickness on the order of 4 to 15 nm for this example of IGFET 1.

Overlying gate dielectric 6 and field oxide 4 is layer 8 of polycrystalline silicon, which will serve as the lower layer of the gate electrode of the transistor. Polysilicon layer 8 is preferably deposited by conventional techniques, such as chemical vapor deposition, to a thickness on the order of 20 to 100 nm, for example 50 nm. Polysilicon layer 8 is also preferably doped, either in-situ with its deposition or by way of subsequent doping or implantation processes, so as to be quite conductive, having a sheet resistivity on the order of 20 to 5000 ohms/square.

Figure 2B:
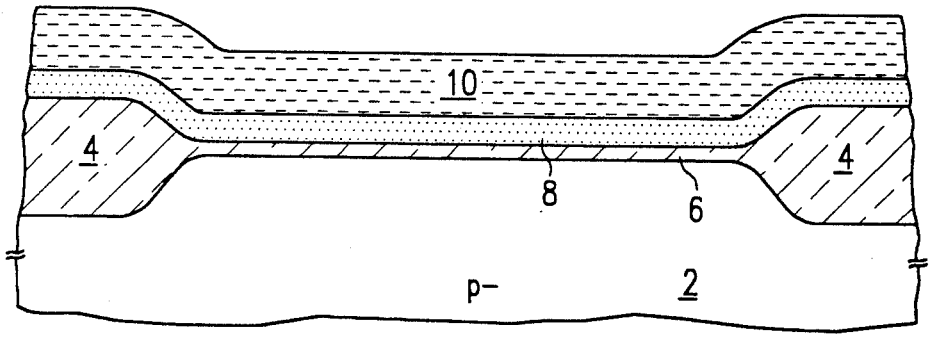

After the deposition of polysilicon layer 8, and its doping, upper gate layer 10 of refractory metal or refractory metal silicide is deposited thereover, as shown in FIG. 2b. The composition of upper gate layer 10 is preferably selected to be etched selectively relative to polysilicon, as will be apparent hereinbelow. A preferred material for upper gate layer 10 is tantalum silicide, of a thickness on the order of 100 nm to 400 nm.

According to conventional methods of forming stacked structures of polysilicon and silicide, the deposition and doping of polysilicon layer 8 may be performed in separate equipment from the subsequent deposition of upper gate layer 10. If necessary or desired for the removal of native oxide and other contamination, a brief dip of the wafer may be performed after formation of polysilicon lower gate layer 8. Alternatively, upper gate layer 10 may be deposited in the same chamber as the deposition of polysilicon (including in-situ doping thereof during such deposition, if desired), without removal of the wafer between the deposition operations, which would preclude formation of a native oxide layer on the surface of polysilicon layer 8.

Figure 2C:
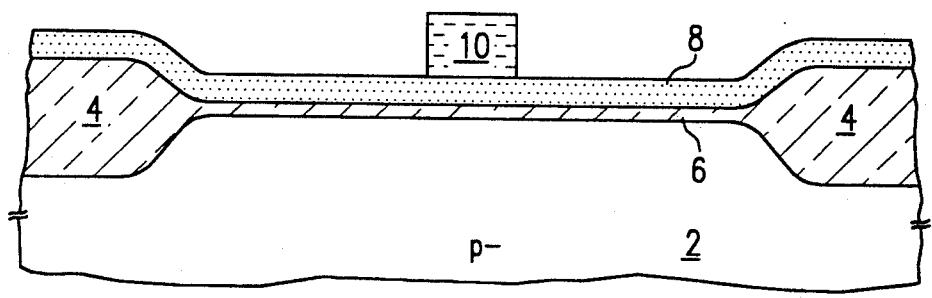

Upper gate layer 10 is then preferably patterned according to conventional photolithography techniques to define the width of the upper portion of the inverted-T gate electrode and, according to the invention, the edges of the source/drain extensions 13 (as implanted). Upon protecting those portions of upper gate layer 10 that are to remain with photoresist or another masking layer, upper gate layer 10 is etched with an etchant species which removes exposed portions of upper gate layer 10 but which does not substantially etch the underlying polysilicon layer 8. In addition, due to the small geometries (e.g., the width of the upper portion of the gate electrode to be on the order of one-half micron or less), it is strongly preferred that the etch be anisotropic. In the preferred embodiment, where upper gate layer 10 is formed of a deposited tantalum silicide, the preferred etch is a plasma etch using a "FREON" fluorinated hydrocarbon-based chemistry, such chemistries being well known in the art. FIG. 2c illustrates IGFET 1 after such an etch, showing upper gate layer 10 as defined by the etch, with polysilicon layer 8 remaining over the entire active region (and field oxide 4).

Figure 2D:
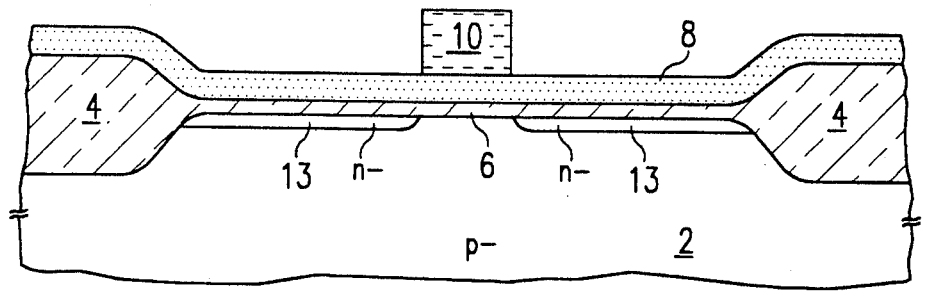

At this point in the process, lightly-doped source/drain extensions 13 may be formed by way of the ion implantation of n-type dopant species, such as arsenic or phosphorous, of sufficient energy to penetrate polysilicon layer 8 and gate dielectric 6, but of low enough energy as to not penetrate upper gate layer 10. This ion implantation is often referred to as the reachthrough implant. The dose of the ion implantation is selected to provide the desired graded junction in the eventually formed IGFET 1. For example, where the thickness of polysilicon layer 8 is on the order of 50 nm, and where upper gate layer 10 is tantalum silicide on the order of 300 nm thick, ion implantation of phosphorous at an energy of 50 keV, at a dose of $10^{13}$ cm$^{-2}$, will provide an impurity concentration on the order of 1E17 in source/drain extensions 13, after anneal. FIG. 2d illustrates the locations at which lightly-doped source/drain regions 13 are formed, after a high temperature anneal to diffuse the implanted dopant.

It should be noted, however, that annealing of the structure to diffuse the implanted dopant may not necessarily be performed after the implantation of FIG. 2d, but may alternatively be done after all implants are performed (i.e., after the heavy source/drain implant). In addition, it should be noted that it is also preferable, especially for extremely small n-channel transistors, to implant p-type impurities at this time, using upper gate layer 10 as a mask, to prevent punch-through in the conventional manner.

Figure 2E:
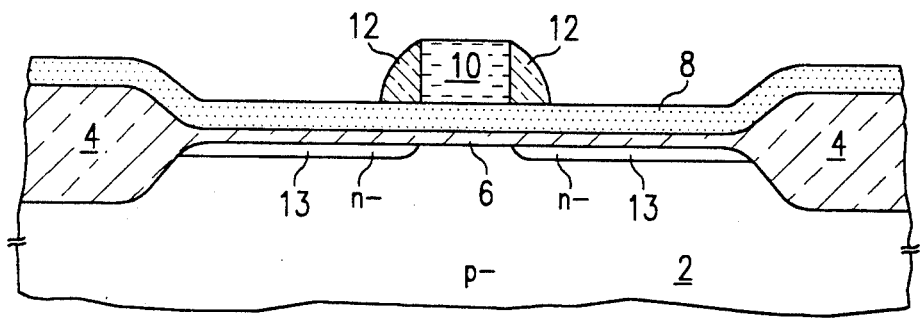

After the ion implantation of the lightly-doped source/drain extensions 13, sidewall spacers 12 are formed on the sides of upper gate layer 10, but overlying polysilicon layer 8, as shown in FIG. 2e. Sidewall spacers 12 may be of silicon dioxide, or such other material known in the art as useful for sidewall spacers. The conventional technique for the formation of oxide spacers 12 is the deposition of a conformal layer of silicon dioxide, for example by the decomposition of TEOS, followed by an anisotropic etch of the oxide layer under conditions where the silicon dioxide is etched without substantially etching the underlying polysilicon layer 8 or upper gate layer 10 material. A preferred technique for this embodiment of the invention is the deposition of 300 nm of silicon dioxide, followed by plasma etching using a "FREON" fluorinated hydrocarbon-based etchant, until clear.

Figure 2F:
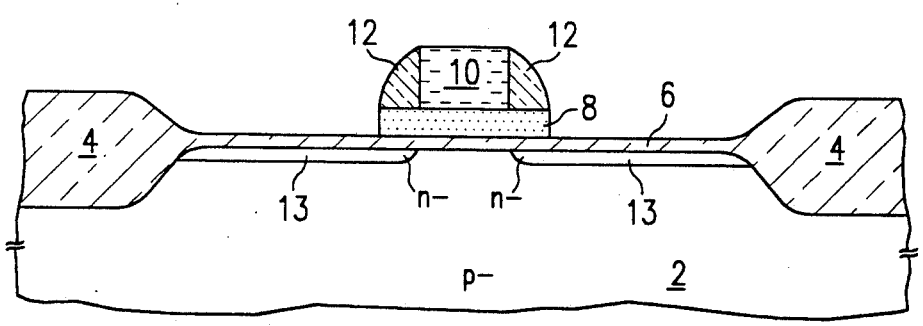

According to this embodiment of the invention, sidewall spacers 12 are used to define the dimensions of polysilicon lower gate layer 8, by serving as a mask to its etching. A preferred etch of polysilicon lower gate layer 8 is a plasma etch using chlorine as the etchant species, so that polysilicon lower gate layer 8 is etched selectively with respect to the material of sidewall spacers 12 and gate dielectric 6 (e.g., silicon dioxide). With sufficient selectivity, polysilicon lower gate layer 8 is etched to clear, as shown in FIG. 2f. The inverted-T shape of the gate electrode formed by polysilicon lower gate layer 8 and silicide upper gate layer 10 is evident in FIG. 2f.

Figure 2G:
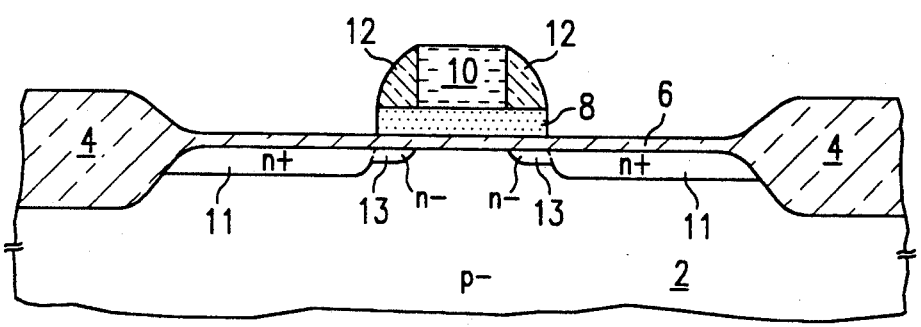

Sidewall spacers 12 not only serve to mask the polysilicon etch of lower gate layer 8, but also may be used as a spacer to define the locations receiving the heavy source/drain implant. The heavy source/drain implant is conventionally performed after removal of gate dielectric 6 over the source and drain regions of the surface. For this example of n-channel IGFET 1, the source/drain regions may be formed by the ion implantation of arsenic, of dose 1E16 cm$^{-2}$, at an energy of 60 keV, (alternatively, phosphorous at 1E16 cm$^{-2}$ at 45 keV may be implanted instead of or in addition to the arsenic implant), which penetrates gate dielectric 6 but which does not penetrate the mask formed of the gate electrode 8, 10 and sidewall spacers 12. After anneal (which may or may not be performed immediately after implant, as is well known in the art), source/drain regions 11 are formed as shown in FIG. 2g. A typical junction depth for IGFET 1 having a channel length on the order of 0.5μ, is on the order of 0.15μ. The resultant structure is illustrated in FIG. 1.

The integrated circuit is then completed by the forming of conventional metal interconnection to the active regions. The method described hereinabove thus forms an inverted-T overlapping gate electrode transistor with relatively simple processing steps. As a result, the benefits of the overlapping gate electrode transistor in providing a reliable transistor structure, due to the graded junctions, with minimal performance degradation, due to the overlapping gate electrode, are achieved by a robust and manufacturable process.

Figure 3A:
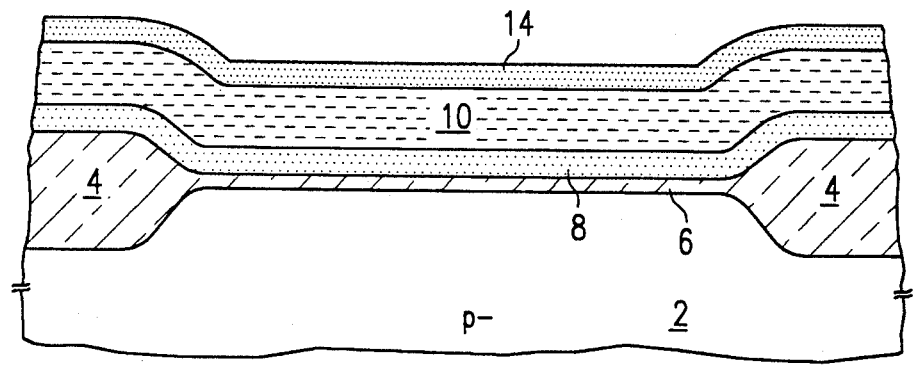
FIGS. 3a through 3d are cross-sectional diagrams of an IGFET according to an alternate embodiment of the invention, including particular steps in the fabrication thereof.

Referring now to FIGS. 3a through 3d, an alternative method of forming a transistor according to the invention, including the self-aligned silicidation of the source and drain regions, will now be described. Referring to FIG. 3a, the transistor formed according to this alternative is illustrated at substantially the same stage as FIG. 2b discussed hereinabove. In addition to the deposition of silicide upper layer 10, however, according to this embodiment of the invention a second polysilicon layer 14 is deposited over silicide upper layer 10. The thickness of polysilicon layer 14 is preferably on the order of 20 to 100 nm, for example 50 nm, similarly as polysilicon lower layer 8.

Figure 3B:
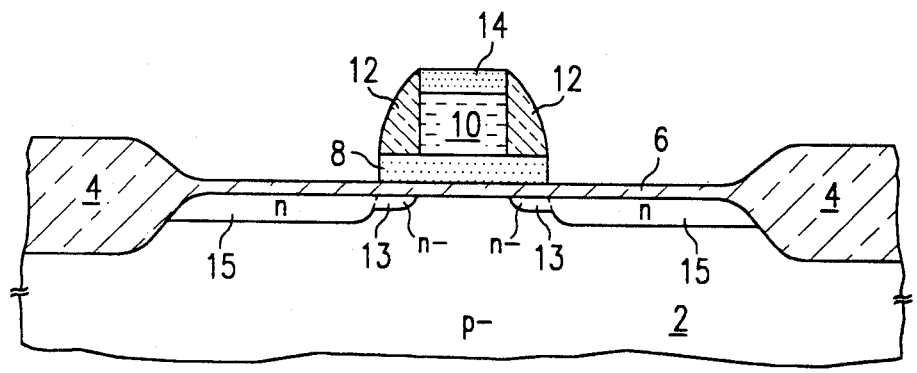

Referring now to FIG. 3b, the structure according to this alternative embodiment of the invention is illustrated, after formation of lightly-doped source/drain extensions 13, in similar fashion as described hereinabove relative to FIGS. 2c through 2g. The gate electrode structure includes polysilicon lower gate layer 8, silicide upper gate layer 10, and sidewall spacers 12; in addition, the top surface of the gate electrode is formed by polysilicon layer 14, patterned and etched together with silicide gate electrode 10 to have substantially the same width. It should be noted that the etching of polysilicon layer 14 and silicide upper gate layer 10 is preferably done in a two-step manner, with the first step being a plasma etch with an etchant species such as chlorine which etches polysilicon (and which may or may not etch silicide layer 10); this first step is preferably a timed step, and is for removing polysilicon layer 14 in the unmasked locations. The second step in the etch is preferably a plasma etch using a "FREON" fluorinated hydrocarbon as the active species, which etches silicide layer 10 in a highly selective manner relative to polysilicon, as discussed hereinabove.

It should also be noted that polysilicon layer 14 is preferably masked during the etching of polysilicon lower gate layer 8, or else it will be removed during the etching thereof. Alternatively, polysilicon layer 14 may be deposited to be much thicker than polysilicon lower gate layer 8, and a timed etch performed to fully etch polysilicon lower gate layer 8 without removing all of polysilicon layer 14.

The transistor formed according to this alternative embodiment of the invention provides additional grading of the source/drain junctions. In the structure at the point of its manufacture shown in FIG. 3b, doped regions 15 are less heavily doped than the eventual source/drain regions will be, but more heavily doped than lightly-doped source/drain extensions 13. For example, the implant conditions for the implantation of doped regions 15 may be an implant of arsenic of a dose of $10^{15}$ cm$^{-2}$ at an energy of 60 keV, so that after source/drain anneal, an approximate impurity concentration of $10^{18}$ cm$^{-3}$ will be present in the portions 15 between source/drain extensions 13 and the eventual source/drain regions. It should be noted that the inner edge of the implanted locations is defined by the edge of sidewall spacers 12 and lower gate layer 8, as in the case of the source/drain implant for IGFET 1.

Again, it should be noted that FIGS. 3a and 3b illustrate the approximate locations of the as-diffused junctions, for purposes of clarity of description. It should be noted that a single source/drain anneal is preferably performed after all regions have been implanted, rather than performing a separate diffusion anneal after each ion implant step as is suggested by the Figures.

Figure 3C:
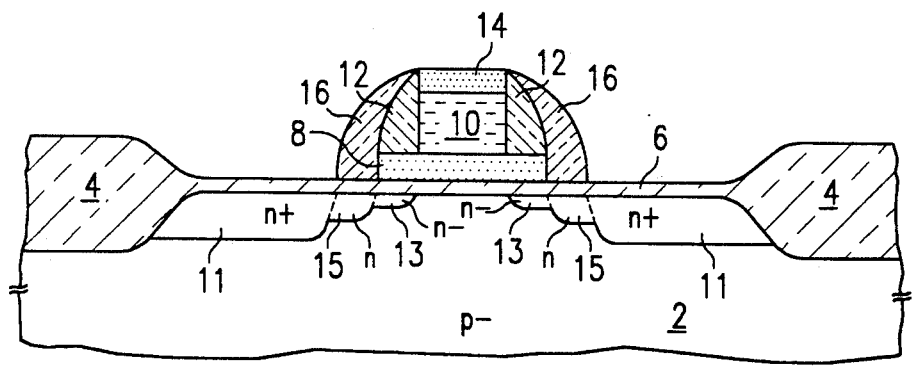

Referring now to FIG. 3c, the next step according to this alternative embodiment of the invention will now be shown. A second sidewall spacer 16 is formed on the outside of first sidewall spacers 12 and lower gate layer 8, by the deposition of a conformal oxide layer to a thickness on the order of 150 nm, followed by anisotropic etch, in the same manner as the first sidewall spacers 12 were formed as described hereinabove.

According to this embodiment of the invention, while the thickness of sidewall spacers 12 was selected in order to define the length of lightly-doped source/drain extensions 13, and the overlapping portions of lower gate layer 8, the thickness of sidewall spacer 16 is preferably selected to ensure that self-aligned silicidation does not short the source/drain regions to the gate electrode. It should be noted that, especially for small channel length transistors, the desired length of the lightly-doped source/drain extensions 13 may be quite short in order to achieve the optimum reliability versus series resistance tradeoff; however, this desired length may not be sufficient to keep the self-aligned silicide from shorting the source/drain regions to the gate electrode. As a result, according to prior methods, the thickness of the sidewall spacers would have to be greater than desired for purposes of transistor performance in order to reduce the tendency of short circuits to form as a result of the silicidation; alternatively, the silicide thickness may be reduced from that desired from a conductivity standpoint in order to prevent such shorting.

Outer sidewall spacers 16 thus define the locations at which the source/drain regions will be clad with silicide. In addition, as shown in FIG. 3c, the provision of outer sidewall spacers 16 can provide additional junction grading, due to intermediately-doped regions 15 thereunder, as the locations of heavily-doped source/drain regions 11 are defined by outer sidewall spacers 16. The implant conditions for source/drain regions 11 are similar as discussed hereinabove for IGFET 1, with sufficient energy to penetrate gate dielectric 6 to the desired junction depth, but insufficient to penetrate the gate electrode structure. After anneal, the three portions of the source and drain of the device are as shown in FIG. 3c, providing additional grading.

Figure 3D:
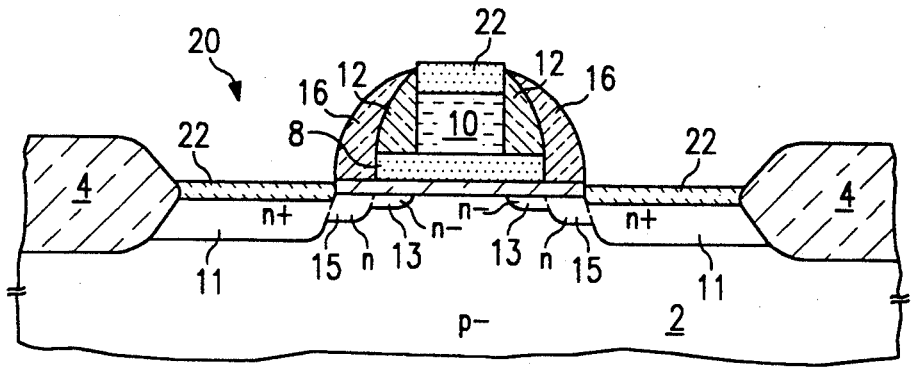

Referring now to FIG. 3d, IGFET 20 formed according to the method described herein relative to FIGS. 3a through 3c is shown, after removal of gate dielectric 6 from the surface of source/drain regions 11, and after direct react silicidation. The direct react silicidation is performed in the conventional manner by the deposition of a refractory metal such as titanium, cobalt, tungsten and the like, followed by anneal of the structure to react the refractory metal with the silicon at locations where the metal is in contact therewith, leaving the metal unreacted elsewhere. In this embodiment, the deposited refractory metal is in contact with the silicon of the source/drain regions 11, and with polysilicon layer 14 at the top of the gate electrode structure. For a preferred example where the refractory metal is titanium, the direct react silicidation is performed at a temperature on the order of 600° C. for on the order of thirty minutes in a nitrogen atmosphere. After the reaction, an etch using a mixture of sulfuric acid and hydrogen peroxide removes the unreacted metal, leaving silicide film 22 at the surfaces of the source/drain regions 11 and the gate electrode, as shown in FIG. 3d. Electrical connection to the silicide regions may then be accomplished in the conventional manner.

It should be noted that the benefits of the multiple sidewall spacer method described hereinabove may also be obtained in a conventional (i.e., non-inverted-T gate electrode) structure. Referring now to FIGS. 4a through 4d, a method of silicide cladding an LDD transistor according to another alternative embodiment of the invention will now be described.

Figure 4A:
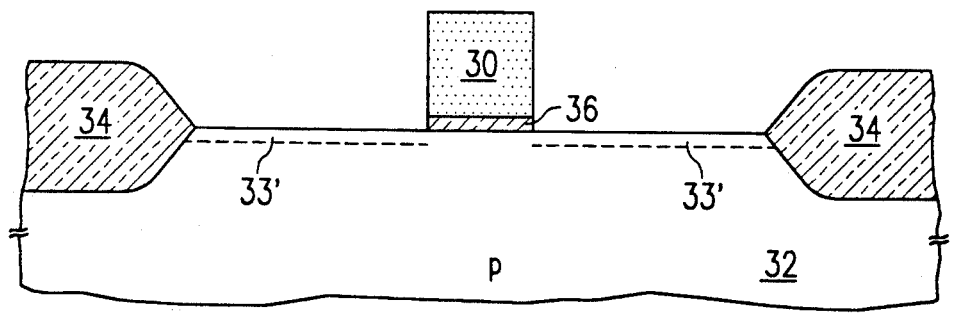
FIGS. 4a through 4d are cross-sectional diagrams of an IGFET according to another alternate embodiment of the invention, including particular steps in the fabrication thereof.

In FIG. 4a, polysilicon gate electrode 30 is shown as disposed over p-type layer 32, with gate dielectric 36 disposed therebetween, in the conventional manner and constructed of conventional materials. For example, gate electrode 30 may consist of doped polycrystalline silicon, having a thickness on the order of 300 to 500 nm; alternatively, gate electrode 30 may be formed of multiple layers, for example, of a lower polysilicon layer having a thickness on the order of 100 to 200 nm, a refractory metal silicide layer thereover having a thickness on the order of 100 to 300 nm, and a top polysilicon layer having a thickness on the order of 50 to 100 nm. Other conventional gate structures having a silicon top surface (to be silicided by direct react silicidation) may alternatively be used.

Also shown in FIG. 4a is n-type dopant 33', in the locations at which it is implanted in order to form lightly-doped source/drain extensions as will be described hereinbelow. The conditions for this implant are similar as described hereinabove, and as conventional, for the formation of such source/drain extensions. In addition, a halo implant of opposite conductivity type from that of the source/drain regions (i.e., a p-type dopant such as boron, in an n-channel transistor) is preferably implanted at this time, using gate electrode 30 as a mask; such a halo implant limits the depletion regions of the source/drain regions, as is well known in the art, so that the punchthrough voltage is increased. A halo implant is especially preferred for transistors with channel lengths less than one micron, as the punchthrough voltages can be quite low in such devices.

Figure 4B:
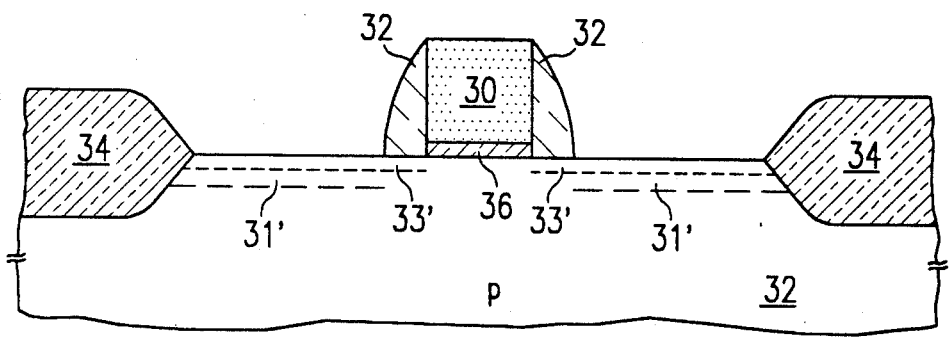

Referring now to FIG. 4b, inner sidewall spacers 32 are formed on the sides of gate electrode 30, by the deposition of a conformal oxide followed by an anisotropic etch, as described hereinabove and as conventional in the art. The thickness of inner sidewall spacers 32 is selected in order to define the length of the lightly-doped source/drain extensions, that is, to define the inner edge at which the next heavier ion implant (e.g., source/drain implant) is to be located. For a submicron transistor according to this example, the thickness of the deposited conformal oxide is on the order of 200 to 400 nm. Ion implantation of the source/drain regions (in this example), is then performed, using conventional ion implantation conditions as noted hereinabove, resulting in the implanted dopant locations 31' illustrated in FIG. 4b.

It should be noted that, alternatively to the formation of the sidewall spacers 32 shown in FIG. 4b, the source/drain implant (or next heavier implant) may be performed prior to etchback of the conformal oxide layer deposited over the structure. In this case, the oxide layer would be continuous over the structure in the diagram of FIG. 4b, rather than with the discrete spacers 32 illustrated therein. The thickness of this conformal oxide layer, in such a case, must of course be reconciled with the implant energy and desired implant depth of the source/drain implant and therefore will have an upper thickness limit for conventional ion implantation.

Further in the alternative, it should be noted that an additional ion implantation may be performed at this stage, to provide an intermediately-doped source/drain extension which is masked by inner sidewall spacers 32, in similar manner as described above relative to IGFET 20 of FIGS. 3a through 3d.

Figure 4C:
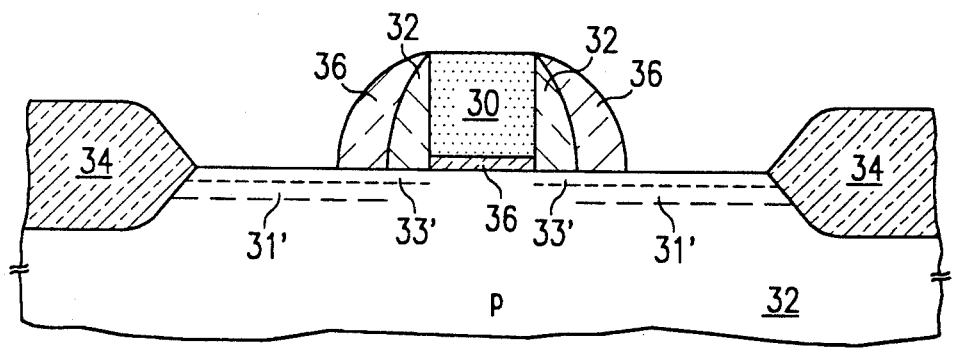

Referring now to FIG. 4c, outer sidewall spacers 36 are formed on the outside of inner sidewall spacers 32 in the conventional manner of depositing a conformal oxide and etching back the same with an anisotropic etch. The thickness of outer sidewall spacers 36 is selected so that the eventual silicide cladding the source/drain regions and the gate electrode does not short out; for example, the thickness of the conformal oxide layer forming outer spacers 36 may be on the order of 200 to 300 nm. According to this embodiment of the invention, the location of the heavy source/drain implant, and thus the length of the lightly-doped extensions, is defined by the thickness of inner sidewall spacers 32. As such, the graded source/drain junction dimensions is defined independently from the silicidation process, and thus may be optimized relative to transistor performance. The use of outer sidewall spacers 36 to define the silicide spacing relieves the process from attempting to optimize the junction grading also together with the minimum spacing to avoid significant silicide shorting.

Figure 4D:
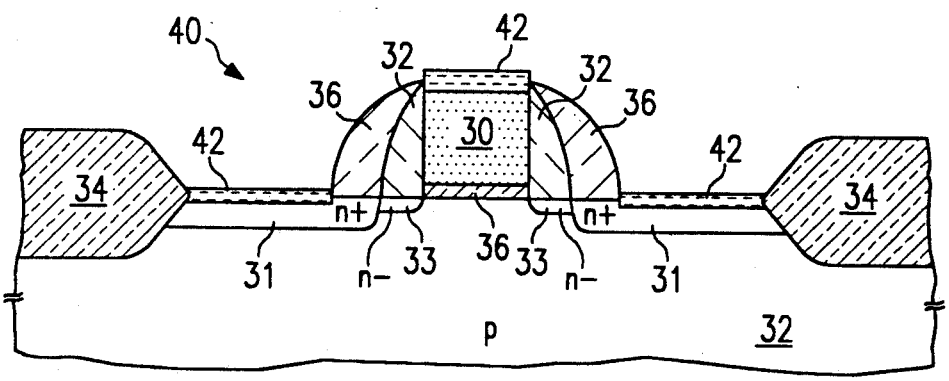

Referring to FIG. 4d, IGFET 40 is shown after direct react silicidation for cladding the source/drain regions 31 and gate electrode 30, and after such annealing as required to drive the implanted dopant to its desired junction depth. Silicide film 42 is formed, as described hereinabove, by the reaction of a refractory metal such as titanium, cobalt, tungsten or the like with silicon with which it is in contact, followed by an etch to clear the unreacted metal. It should be noted that, in this embodiment of the invention, heavily doped source/drain regions 31 are located under the outer sidewall spacers 36, and are not silicided thereat due to the presence of outer spacers 36. Accordingly, transistor 40 is formed in such a manner as to have its graded source/drain junctions defined independently from the definition of its silicidation regions, allowing for high direct react silicidation yield, and optimized transistor performance parameters.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of forming an insulated-gate field-effect transistor, comprising the steps of:
    forming a gate dielectric over an active region of a semiconductor surface, said active region of a first conductivity type;
    forming a lower gate layer comprising polycrystalline silicon over said gate dielectric;
    forming an upper gate layer over said lower gate layer, said upper gate layer comprising polycrystalline silicon having a different dopant concentration from that of said lower gate layer;
    removing selected portions of said upper gate layer with an etchant which removes the material of said upper gate layer at a much higher rate than the rate at which it removes the material of said lower gate layer, to provide an upper gate electrode of said upper gate layer material at a selected location;
    implanting dopant of a second conductivity type in such a manner that it is masked by said upper gate electrode but is not masked by said lower gate layer;
    forming sidewall spacers on the sides of said upper gate electrode; and
    removing portions of said lower gate layer not below said sidewall spacers, to provide a lower gate electrode in contact with said upper gate electrode, disposed under said upper gate electrode and under said sidewall spacers.

2. The method of claim 1, wherein said sidewall spacers comprise silicon dioxide.

3. The method of claim 1, further comprising:
    after said step of forming sidewall spacers, implanting dopant of a second conductivity type in such a manner that it is masked by said upper gate electrode and said sidewall spacers.

4. The method of claim 1, further comprising:
    forming outer sidewall spacers on the sides of said sidewall spacers and said lower gate electrode, after said step of removing portions of said lower gate electrode layer.

5. The method of claim 4, further comprising:
    prior to said step of forming outer sidewall spacers, and after said step of forming sidewall spacers, implanting dopant of a second conductivity type in such a manner that it is masked by said upper gate electrode and said sidewall spacers.

6. The method of claim 5, further comprising:
    forming a silicide film at the surface of said active region outside of said outer sidewall spacers.

7. The method of claim 6, wherein said semiconducting surface comprises silicon;

wherein said step of forming said silicide film comprises:
depositing a metal film overall;
reacting the metal film with the silicon of semiconducting surface at locations outside of said outer spacers to form a silicide thereat; and
removing the portions of said metal film not reacted in said reacting step.

8. The method of claim 4, wherein said step of forming said outer sidewall spacers comprises:
depositing a dielectric film overall; and
anisotropically etching said deposited dielectric film.

9. The method of claim 5, further comprising:
after said step of forming said outer sidewall spacers, implanting dopant of a second conductivity type in such a manner that it is masked by said upper gate electrode, said sidewall spacers, and said outer sidewall spacers.

10. An insulated-gate field-effect transistor, comprising:
source and drain regions, of a first conductivity type, disposed at a semiconducting surface and spaced apart from one another, said source and drain regions each having relatively lightly-doped extensions thereof extending toward one another and spaced apart by a channel portion of said semiconductor surface of a second conductivity type;
a gate dielectric disposed over said channel portion and said source and drain extensions;
a gate electrode, comprising:
a lower gate electrode portion, comprising polycrystalline silicon, and disposed over said gate dielectric to overlie said channel portion and said source and drain extensions; and
an upper gate electrode portion, comprising polycrystalline silicon, and disposed over and in electrical contact with said lower gate electrode; and
dielectric sidewall spacers, disposed on the sides of said upper gate electrode portion and overlying said lower gate electrode portion;
wherein the dopant concentration of said upper gate electrode portion is different from that of said lower gate electrode portion in such a manner that said upper gate electrode portion may be etched selectively relative to said lower gate electrode portion.

11. The transistor of claim 10, further comprising:
outer dielectric sidewall spacers, disposed on the sides of said dielectric sidewall spacers and said lower gate electrode portion; and
silicide film disposed on the surface of said source and drain regions, and spaced from said lower gate electrode portion by said outer dielectric sidewall spacers.

12. The transistor of claim 11, further comprising:
silicide film disposed on the top surface of said upper gate electrode portion, and spaced from the silicide film disposed on the surface of said source and drain regions by said outer dielectric sidewall spacers.

* * * * *